United States Patent [19]
Ahmad et al.

[11] Patent Number: 5,238,710
[45] Date of Patent: Aug. 24, 1993

[54] MICROWAVE ENERGY-ASSISTED CHEMICAL VAPOR INFILTRATION

[75] Inventors: Iftikhar Ahmad, Fairfax, Va.; Edward L. Paquette, Severna Park, Md.; Richard Silberglitt, Fairfax, Va.

[73] Assignee: Technology Assessment & Transfer, Inc., Annapolis, Md.

[21] Appl. No.: 859,790

[22] Filed: Mar. 30, 1992

[51] Int. Cl.$^5$ .............................................. B05D 3/02
[52] U.S. Cl. ...................... 427/553; 427/226; 427/237; 427/238; 427/253; 427/255; 427/274; 427/294; 427/383.5; 427/557; 427/585; 427/595
[58] Field of Search ............... 427/553, 226, 237, 238, 427/255, 274.3, 294, 253, 383.5, 557, 585, 595

[56] References Cited

U.S. PATENT DOCUMENTS

| | | | |
|---|---|---|---|
| 4,580,524 | 4/1986 | Lackey, Jr. et al. | 118/725 |
| 4,596,741 | 6/1986 | Endou et al. | 428/368 |
| 4,663,230 | 5/1987 | Tennent | 428/367 |
| 4,929,328 | 5/1990 | Besmann et al. | 204/279 |
| 4,960,640 | 10/1990 | Paquette et al. | 428/368 |

OTHER PUBLICATIONS

Evans et al., A Mathematical Model for Microwave-Assisted Chemical Vapor Infiltration, *Mat. Res. Soc. Symp. Proc.* vol. 189, pp. 101–107 (1991).
I. Ahmad, "Effect of Microwave Heating on the Solid State Reactions and Mass Transport in Ceramics", Abstract of Doctoral Dissertation, University of Florida, 1991.
A. S. De, et al. "Microwave (Hybrid) Heading of Alumina at 2.45 GHz: II. Effect of Processing Variables, Heating Rates and Particle Size" Ceramic Transactions, vol. 21, p. 329 (1991).
Ahmad, et al., Microwave Power and Electromagnetic Energy, vol. 26, No. 3, p. 128 (1991).
A. S. De, et al., "Microwave (Hybrid) Heating of Alumina at 2.45 GHz: I Microstructural Uniformity and Homogeneity" Ceramic Transactions, vol. 21. p. 319, (1991).

*Primary Examiner*—Bernard Pianalto
*Attorney, Agent, or Firm*—Rothwell, Figg, Ernst & Kurz

[57] ABSTRACT

A method for the production of ceramic matrix composites by chemical vapor infiltration. The method includes exposing an infiltrated preform to microwave energy, with pressure variation of the reactant gases in the processing chamber and/or temperature variation of the preform during processing, to produce substantially improved composites. The process provides higher deposition rates within the core of the ceramic matrix composite, higher densification which advantageously initiates within the interior of the ceramic matrix composite and proceeds radially outward, and a thick wall ceramic matrix composite with an overall reduced density gradient.

16 Claims, 3 Drawing Sheets

MICROWAVE ENERGY-ASSISTED CHEMICAL VAPOR INFILTRATION

BACKGROUND OF THE INVENTION

1. Field of the Invention

The present invention relates generally to improvements to chemical vapor infiltration processes and apparatus for the preparation of reinforced ceramic matrix composites. More particularly, the present invention relates to the use of microwave energy heating during the production of reinforced ceramic composites in a non-steady state chemical vapor infiltration process.

2. Description of the Background Art

Chemical Vapor Infiltration ("CVI") is a well-known technique for the production of reinforced ceramic composites. The CVI process is capable of incorporating continuous ceramic fibers into a ceramic composite without mechanically, chemically or thermally damaging the fibers. In the CVI process, ceramic precursors (i.e., vaporized organometallic ceramic matrix precursor(s) and associated carrier and process gases, which are referred to collectively as "ceramic precursor reactant gasses" herein) infiltrate into a preform, such as a fibrous preform consisting of SiC, graphite and/or other ceramic fibers. With the application of sufficient heat, a chemical reaction occurs between the ceramic precursor compounds and other components of the reactant gas, whereby ceramic material is deposited upon the fibers, producing a two-phase matrix.

CVI processes typically are isothermal processes which require the reactant gases to diffuse into the fibrous preform. These processes are well-suited for the fabrication of thin-walled composites of complex shapes Usually, the process is controlled so that densification proceeds very slowly, in order to maximize the deep diffusion of the reactants into the preform and to permit the reaction by-products to diffuse out of the preform. A low deposition rate is intentionally maintained in order to prevent (to the extent possible) sealing the exterior surface of the preform before the interior is densified. Despite these efforts, significant density gradients typically are observed because of the greater deposition of material on the surface of the preform Even for thin composite structures of the order of one fourth of an inch (6–7 mm), very long processing times are required. For thick wall components, the processing time may exceed 500 hours, making this process extremely expensive.

A modified process for the fabrication of CVI ceramic-ceramic composites, which utilizes thermal as well as pressure gradients to reduce the infiltration time, is described in U.S. Pat. No. 4,580,524 (Lackey, Jr. et al.; Apr. 8, 1986). As described therein, a fibrous preform is placed within a graphite holder which is water-cooled. The reactant gases are introduced at the cool side of the preform. The other end of the preform is exposed to the furnace, creating a sharp thermal gradient across the preform. The gases introduced at the cool side, because of the pressure, continue to diffuse into the hot region, forming the matrix material on the fibers of the preform. The by-product is released and exhausted through the perforated lid into the hot zone. The deposition of the matrix material in the hot portion of the preform increases the density as well as the thermal conductivity of the fibrous preform. The increase in thermal conductivity allows the deposition region to move from the hot surface to the cooler surface. This process is limited by the permeability of the densified composite which prevents sufficient flow of the reactant gases into the preform because of the back pressure of the by-product released during the reaction. Nevertheless, this is an efficient method for fabricating composites having a small wall thicknesses. The production of more than one preform at the same time in the same furnace using this method is a serious engineering challenge, however, because of the thermal hydrodynamic complexity of such a processing configuration.

Another known chemical vapor infiltration process is characterized as a pressure variant, isothermal CVI process. The absolute pressure in the infiltration hot zone is rapidly varied or "pulsed" from nominally 5 to 25 torr. Flow resistance of the porous composite structure produces a lead/lag pressure differential, which although very small, significantly increases mass transfer over that obtainable by purely diffusion-related mass transport mechanisms. This process is described in U.S. Pat. No. 4,960,640 (Paquette, et al.; Oct. 2, 1990). The process provides only very slight depth of infiltration performance advantages over low temperature isothermal, isopressure chemical vapor infiltration, however.

For these reasons, fabrication of ceramic matrix composites using conventional chemical vapor infiltration processes is typically limited to composites where total wall thickness is on the order of ¼" to no more than ⅜". Accordingly, there has been a need for further improvements to processes for producing reinforced ceramic composites, especially composites having wall thicknesses on the order of one inch or more.

In recent years there has been a growth in the use of microwave energy for the processing of materials. See Materials Research Society (MRS) Symposium Proceedings, Vol. 124 (Sutton et al., 1988) and Vol. 189 (Snyder et al., 1991); Ceramic Transactions, Vol. 21 (Clark et al., 1991). Important applications of microwave energy include ceramic drying, binder burnout, sintering of ceramics and composites, joining of ceramics, fabrication of optical fibers in a Modified Chemical Vapor Deposition (MCVD) station and combustion of reactants for the synthesis of ceramics and composites.

The combustion synthesis of ceramics and composites is an interesting application, providing evidence of reactions (ignition) initiating at the center of the sample, with the combustion wavefront propagating radially outward (Ahmad et al., J. Microwave power and Electromagnetic Energy, Vol. 26, No. 3, p. 128, 1991). The lower density compacts had higher heating rates and the ignition and wavefront propagation was much faster than in the high density compacts.

The potential advantages of microwave heating for use in isothermal and temperature gradient (i.e., with active cooling of the sample) CVI processes have been mathematically modelled and described via computer simulation under steady state processing conditions in Evans et al., A Mathematical Model for Microwave-Assisted Chemical Vapor Infiltration, Mat. Res. Soc. Symp. Proc. vol. 189, pp. 101–107 (1991). Evans et al. do not disclose or suggest the use of non-steady-state conditions, however, such as the use of cyclic or pulsed variation in the application of microwave energy and/or pressure variation within the reaction chamber.

Accordingly, the present invention provides improvements to CVI processes for the production of reinforced ceramic composites. These improvements will include improvements in the thickness of fabricated composites as well as improvements in the overall efficiency (for example speed and cost) of fabrication.

SUMMARY OF THE INVENTION

In one aspect, this invention provides a chemical vapor infiltration process for the production of a reinforced ceramic composite comprising irradiating a ceramic precursor reactant gas-infiltrated preform, such as a fibrous preform, with microwave energy under non-steady state temperature and/or pressure conditions. Ceramic deposition advantageously takes place in the relatively hot interior of the preform, while the diffusion of by-products towards the exterior of the preform reduce premature "sealing" which otherwise limits the overall obtainable thickness. Deposition proceeds from the interior of the preform to the exterior, providing for the fabrication of composites with comparatively large wall thickness.

In one particular aspect, the invention provides a CVI process for the production of reinforced ceramic composites which comprises infiltrating ceramic precursor reactant gasses into a vapor-permeable preform and irradiating the infiltrated preform with microwave energy in a pulsed cycle, whereby the preform undergoes cycles of heating and cooling due to the cyclic application of the microwave energy.

In another aspect, the invention provides a CVI process for the production of reinforced ceramic composites which comprises infiltrating ceramic precursor reactant gasses into a vapor-permeable preform within a pressure chamber, varying the pressure within the chamber at a predetermined rate between predetermined upper and lower pressure limits, and irradiating the preform with microwave energy.

In yet another aspect of the invention, the features of pressure variation and a pulsed microwave heating cycle are both employed. In a still further aspect of the invention, reactant gasses infiltrate a preform which is exposed to both microwave and conventional (for example radiant) heating.

The present invention also relates to apparatus for carrying out the inventive process.

DETAILED DESCRIPTION OF THE PREFERRED EMBODIMENTS

This invention presents a method and apparatus for the production of ceramic matrix composites by chemical vapor infiltration. Microwave heating, in combination with either pressure variation of the reactant gases in the processing chamber, and/or temperature cycling of the ceramic being processed, produces (1) higher deposition rates within the core of the ceramic matrix composite, (2) higher densification initiating within the interior of the ceramic matrix composites and which proceeds radially outward and (3) a thicker walled ceramic matrix composite with reduced density gradient, in comparison to conventional CVI processes employing radiant heating.

The use of microwave energy in non-steady state conditions for producing ceramic composites in a chemical vapor infiltration process represents a major breakthrough, enabling a fundamental change in the heating process. Heat is generated within the ceramic material itself, rather than originating from an external heating source. This is especially useful for rapid heating of ceramics with low thermal conductivity. Since the surface radiates thermal energy, the internal heating mechanism provides an inverse thermal gradient, with the interior of the sample at higher temperature than the surface. Even low dielectric loss ceramics can be heated very rapidly using the microwave hybrid heating approach, which utilizes radiant as well as microwave energy.

The present invention exploits the advantages of microwave energy combined with non-steady state processing for improving the efficiency and overall results of chemical vapor infiltration processing. These improvements include the direct coupling of microwaves with the composite preform, which results in internal and rapid heating of the preform. The reverse thermal gradient allows higher deposition rates at the high temperature core of the preform. By contrast, in conventional CVI processes, since the surface is at a higher temperature than the core, the rate of deposition is highest at the surface. This inhibits the infiltration of the vapors deep into the preform, and limits the thickness of the composites that can be fabricated by those conventional methods. The use of microwave energy provides a completely different heating pattern, which allows fabrication of thick composites. Furthermore, the enhanced reaction kinetics (Ahmad, Ph.D. dissertation, University of Florida, 1991; Fanslow et al., MRS Vol. 189, p. 43, 1991) play an important role in improving the efficiency of the microwave assisted chemical vapor infiltration process.

As used herein, the term "non-steady state processing" refers to carrying out the CVI process under conditions where either (1) microwave energy is employed in a pulsed or cycled manner to produce a corresponding cyclic temperature profile of the processed composite and/or (2) the pressure within the reaction chamber is pulsed or cycled during at least a portion of the process.

Figure 1:
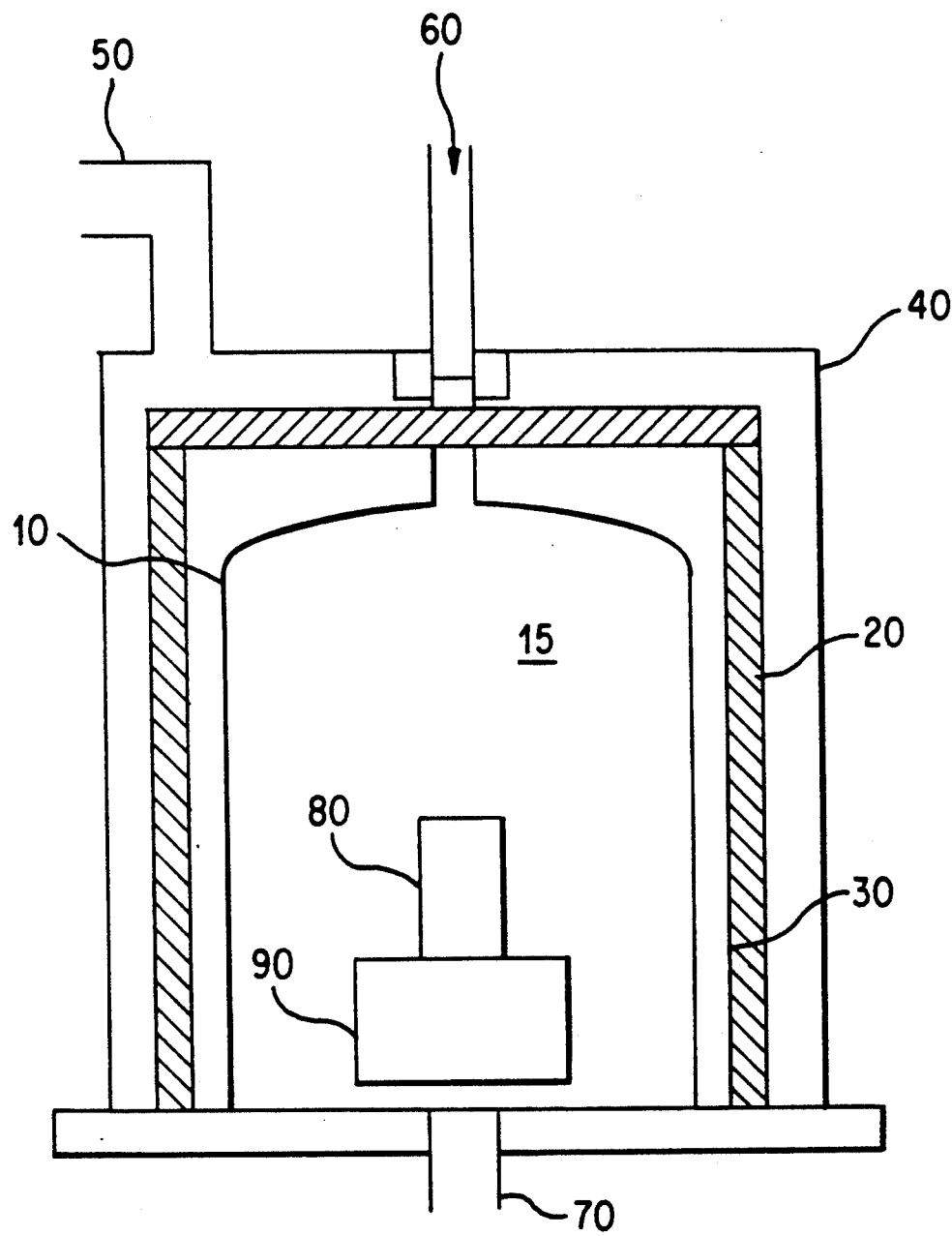
FIG. 1 is a schematic representation of an apparatus for producing ceramic composites according to the present invention.

FIG. 1 schematically depicts an apparatus for carrying out the present process. A chamber composed of fused quartz or other suitable material 10 generally defines a bell-jar shaped interior cavity 15 of the apparatus. The chamber is surrounded by a low density ceramic, for example alumina, insulation layer 20. The inside of the insulation is lined with a microwave suscepting material, for example silicon carbide fabric 30, to allow heating of the entire chamber at the base level temperature (950° C.) with the microwave heater at a lower power level. A metallic microwave cavity 40 covers the entire set up. A wave guide 50 delivers microwave power to the cavity from a microwave source (not shown), which for relatively small applications may be a conventional 900 watt microwave source employed in consumer microwave ovens. Those skilled in the art will of course realize that larger applications will employ higher-output sources of microwave energy.

Reactant gases are delivered via flow controllers and enter the cavity through the inlet port 60. The reaction by-products are evacuated through the outlet port 70 by a vacuum system. Methods of achieving cyclical pressure variations within the furnace include variable valve throttling of the vacuum system, injection of inert gas into the vacuum pumping system, or modulation of reactant mass flow versus time. The sample 80 is placed on an insulative material 90 so that the heat generated within the sample is not conducted away.

The temperature of the preform surface is sensed using optical pyrometry. This temperature measurement is used as the input to a programmable controller which controls the power output of the microwave source to obtain desired temperature cycles.

The automation and control of the flow of reactant gasses and by-products through the system, as well as the provision of programmed pressure variations, are produced and maintained using conventional technology. For example, adjustable, logic sequencer-driven electric (Apollo) valves and vacuum pressure feedback may be employed in cooperation with a programmable controller to control (1) the pressure variant portion of the process between the set pressure boundaries, (2) the desired time scale as well as (3) reversing the direction of reactant flow through the furnace hot zone on a periodic basis to maximize uniformity of process conditions and eliminate flow direction oriented density and compositional gradients.

The preforms suitable for use in the present process are those typically employed in conventional CVI processes, which are well known to those of ordinary skill in the ceramic composite field. Exemplary preforms may be formed from discrete elements, such as fibers and/or grains, or may comprise a sintered material formed, for example, from a slurry containing grains and/or short fibers. Regardless of their precise physical form, the preforms will be generally permeable to the reactant gasses employed, so that the gasses may infiltrate into the interior of the preform. The preform materials typically have a carbon or ceramic base, with SiC or graphite fibers being in relatively common use. Other preform materials include alumina boria fibers, e.g. NEXTEL ®, and alumina.

The reactant gasses employed in the present process also are those typically employed in conventional CVI processes for producing commercially-significant ceramic materials, and are well known to those of ordinary skill in this field. Typically either silicon or a refractory element, such as hafnium, zirconium, tantalum, tungsten or molybdenum is reacted with an element which provides a source of negatively-charged ions, such as carbon, oxygen, boron or nitrogen.

For example, the present process is particularly well suited for the production of silicon carbide (SiC) based ceramics. One preferred reactant gas is composed of a mixture of $CH_3Cl_3Si$ in gaseous form and an excess molar amount of $H_2$. This reactant gas provides the deposition of SiC, and the production of methane ($CH_4$), hydrochloric acid (HCl) and hydrogen gas as by-products. Another preferred reactant gas is composed of $SiCl_4$ or $H_2SiCl_2$, $NH_3$ in gaseous form and an excess molar amount of $H_2$. These reactants result in the deposition of $Si_3N_4$ and the production of $H_2$ and HCl as by-products.

If desired, a material which inhibits the deposition of ceramic materials may be injected into the chamber 10 during processing, in order to further reduce any premature surface densification. HCl is one such suitable material. Other suitable materials include gaseous etchants typically used in the semiconductor industry.

Figure 2:
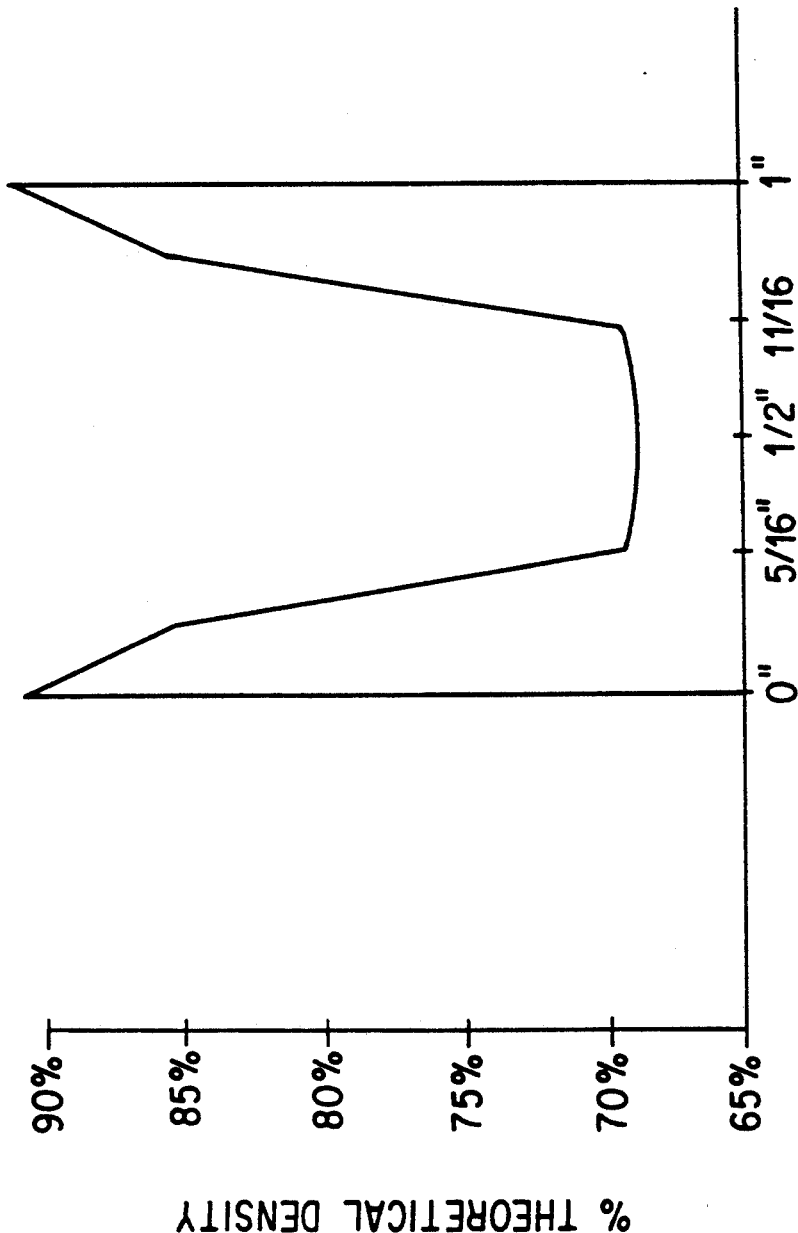
FIG. 2 is a graph depicting a typical densification profile for a ceramic composite prepared according to known chemical vapor infiltration processing utilizing radiant heating.

FIG. 2 illustrates a typical through-the-wall density gradient for a one-inch thick composite prepared via the prior art pressure variant isothermal CVI process. A 1" thick composite of nominally 40% by volume ceramic fiber in fabric laminate form will demonstrate gradients similar to these when prepared by either pressure variant or isopressure CVI processes. The pressure variant CVI process leads to slightly more "smeared" gradient between the relatively thin near surface region which is more highly densified and the relatively large central region of the composite which is at a nearly uniform lower densification. Improved density patterns will be attained via the present invention.

Materials processing by microwave energy, according to the present invention, may be carried out either in a single mode applicator or a multi-mode applicator (or "oven").

A single mode applicator typically contains a relatively small cavity which has a strong variation in electromagnetic field distribution and, therefore, has a corresponding heating distribution. When using a single mode applicator, it is preferable to place the preform at the site where the microwave energy, and thus the applicator's ability to heat, is greatest. Such placement of ceramic material allows the pieces of ceramic material to absorb large amounts of microwave energy efficiently.

In contrast, a multi-mode applicator typically contains a larger cavity which allows a relative uniform electromagnetic field distribution and, therefore, has a uniform heating distribution. A plurality of pieces of ceramic material may be heated evenly throughout a multi-mode applicator. Because the microwave energy is unfocussed, only a small fraction of the total microwave energy is available for heating any one particular piece. Thus, more microwave energy generally is required when a multi-mode applicator is used.

Figure 3:
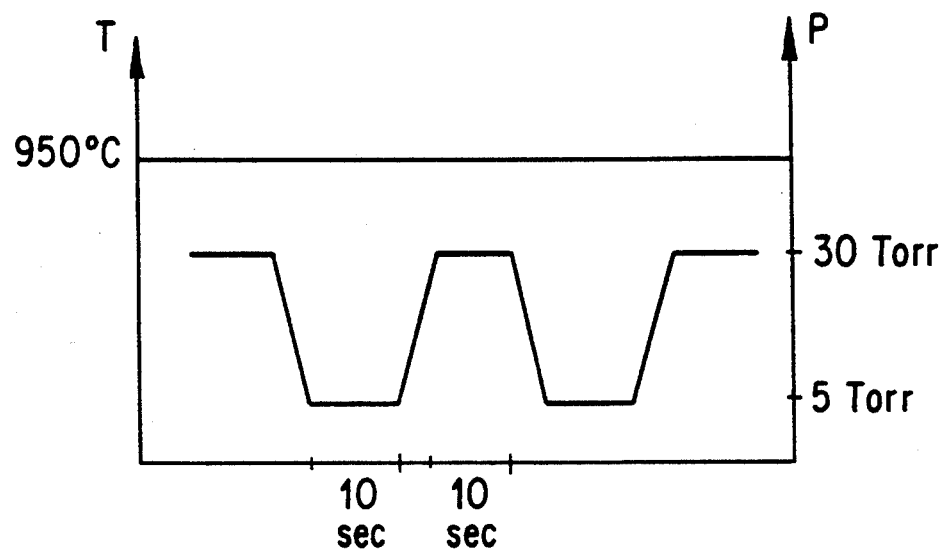
FIG. 3 is a graph depicting a time/pressure/temperature profile for carrying out one embodiment of the present invention wherein pressure is cycled and the temperature of the ceramic is maintained substantially constant.

One embodiment of the present process uses a time-/temperature/pressure profile as shown in FIG. 3. The surface temperature of the preform is sensed and is maintained approximately constant by the programmable controller. The use of microwave heating per the present invention results in a temperature in the interior of the preform that is greater then the surface temperature of the preform, thus improving the overall density gradient pattern.

The application of microwave heating in a precisely controlled manner is believed to provide additional benefits. It has been known that the characteristics of the fiber-matrix bond interface has important effects upon the overall characteristics and strength of the finished composite. The cyclic application of microwave energy may provide additional control over the formation of that bond and thus over the overall properties of the final product.

Figure 4:
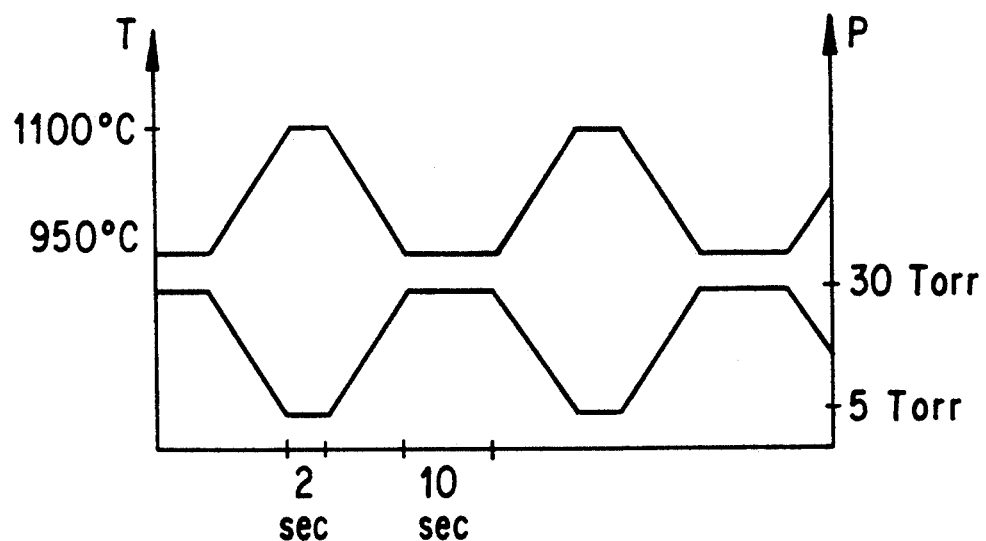
FIG. 4 is a graph depicting a time/pressure/temperature profile for carrying out another embodiment of the present invention wherein temperature and pressure both are varied.

A second embodiment of the process employs a periodic microwave heating cycle together with pressure variation, which reduces the processing time and further increases the maximum depth into the preform that can be infiltrated. This cycle is illustrated in FIG. 4. The cycle includes a heating period during which the reactant gas absolute pressure is reduced from its initial value. The next portion of the cycle has no heating above the baseline temperature (microwave power is reduced) and the reactant pressure level is raised to encourage flow into the preform.

During the heating portion of the cycle, when the microwave power is high, the preform heats internally. The surface radiates thermal energy and is relatively cooler than the interior. The increased temperature at the core of the preform leads to locally higher rates of deposition of ceramic matrix as compared to the surface. Furthermore, the gaseous HCl and/or other by-products released as a consequence of the chemical reaction among the gas components diffuse out of the preform. The lower temperature at the surface and the diffusion of the deposition by-products (HCl) both advantageously suppresses ceramic deposition at the surface of the preform. After the heating portion of cycle, when the temperature of the preform has dropped back to some predetermined lower value, the reactant gases are pressurized again to infiltrate into the preform. HCl may also be injected into the reactor during this latter portion of the cycle to aid in suppressing near-surface deposition.

During the next heating portion of the cycle, the interior will be higher in temperature than the surface. Within the interior region of the preform, any local micro region which did not have enough deposition in the previous cycle will be lower in density, and will heat preferentially as compared to the more densified region in the core. This allows higher deposition rates at the high temperature region in the core of the composite. As the core of the composite densifies, the deposition occurs on the adjacent low density region because of higher microwave heating and higher deposition of the matrix material. Thus, core uniformity is improved as a result of this process. The HCl released, as described earlier, suppresses the deposition of the matrix material on the surface of the preform as it diffuses out of the preform. Thus, unlike the radiant heating CVI process, the composite starts densifying from the interior and the process can be extended to much greater wall thickness than those obtained by conventional processes. The conventional process results in significant density gradients, with lower densities in the interior.

Since the densification process initiates at the core of the preform, the deposition rates can be increased from those determined by conventional CVI processes. It has been demonstrated that microwave heating enhances reaction as well as the diffusion rates (I. Ahmad, Ph.D. Dissertation, University of Florida, 1991). Besides the internal heating mechanism, which allows a different pattern of densification, the enhancement in reactions and diffusion can potentially play a significant role in the chemical vapor infiltration process.

The processes according to the present invention should now be readily apparent A vapor-permeable preform is placed within chamber 10 of the apparatus depicted in FIG. 1. The chamber is sealed, and a ceramic precursor reactant gas stream is admitted through inlet 60 at a pressure of 30 torr. After allowing the gas to infiltrate into the preform, the infiltrated preform is irradiated with microwave energy. The microwave energy is applied so as to bring the surface temperature of the preform to 950° C. The microwave energy and/or the pressure within the oven is cycled as described earlier. Ultimately, the microwave energy source is turned off and the chamber is evacuated of by-product gasses. The finished product is removed from the chamber.

Although the present process has been described in connection with several preferred embodiments and specific examples, it clearly is not so limited. Those knowledgeable in this field will find many useful variations, which are within the spirit and scope of the following claims.

What is claimed is:

1. A process for the production of a reinforced ceramic composite comprising irradiating a ceramic precursor-infiltrated preform with microwave energy under non-steady state temperature and/or pressure conditions.

2. A process for the production of a reinforced ceramic composite comprising infiltrating a ceramic precursor reactant gas into a vapor-permeable preform and irradiating the infiltrated preform with microwave energy under non-steady state temperature and/or pressure conditions and thereby depositing a ceramic material onto the preform.

3. A process according to claim 2 wherein the depositing step is carried out at a pressure of about 30 torr.

4. A process according to claim 2 wherein the microwave energy raises the temperature of the infiltrated preform to a temperature sufficient to cause a chemical reaction in the reactant gas which deposits a ceramic material onto the preform.

5. A process according to claim 2 wherein the microwave energy raises the temperature of the infiltrated preform to at least about 950° C.

6. A process according to claim 2 wherein the infiltrated preform is irradiated with microwave energy in a pulsed cycle whereby the preform undergoes cycles of heating and cooling while the ceramic material is being deposited.

7. A process according to claim 6 wherein the surface temperature of the preform cycles between about 950° and 1100° C. during the depositing step.

8. A process according to claim 2 wherein the depositing step is carried out at a pressure which varies between about 5 and about 30 torr.

9. A process according to claim 2 which further comprises irradiating the infiltrated preform with radiant heat energy.

10. A process according to claim 2 wherein the ceramic precursor reactant gas comprises an organometallic precursor or a metal halide precursor.

11. A process according to claim 2 wherein the reactant gas comprises a mixture of $CH_3Cl_3Si$ and $H_2$.

12. A process according to claim 2 wherein the reactant gas comprises $SiCl_4$ or $H_2SiCl_2$, $NH_3$ and $H_2$.

13. A process according to claim 2 which further comprises administering a ceramic material deposition depressant to the preform during the depositing step.

14. A process according to claim 13 wherein the ceramic material deposition depressant comprises gaseous HCl.

15. A process according to claim 2 wherein the preform comprises SiC fibers.

16. In a chemical vapor deposition process for producing a reinforced ceramic composite by infiltrating a ceramic precursor reactant gas into a vapor-permeable preform and heating the infiltrated preform to a temperature sufficient to cause a chemical reaction in the reactant gas, which results in the deposition of ceramic material onto the preform, the improvement comprising heating the infiltrated preform with microwave energy under non-steady state temperature and/or pressure conditions.

* * * * *